(12) United States Patent
Roll et al.

(10) Patent No.: US 10,977,119 B2
(45) Date of Patent: Apr. 13, 2021

(54) TECHNIQUES FOR UTILIZING VOLATILE MEMORY BUFFERS TO REDUCE PARITY INFORMATION STORED ON A STORAGE DEVICE

(71) Applicant: Apple Inc., Cupertino, CA (US)

(72) Inventors: Eran Roll, Tel Aviv (IL); Stas Mouler, Kfar Saba (IL); Matthew J. Byom, San Jose, CA (US); Andrew W. Vogan, Austin, TX (US); Muhammad N. Ashraf, San Jose, CA (US); Elad Harush, Kiryat Shmona (IL); Roman Guy, Ashkelon (IL)

(73) Assignee: Apple Inc., Cupertino, CA (US)

( * ) Notice: Subject to any disclaimer, the term of this patent is extended or adjusted under 35 U.S.C. 154(b) by 15 days.

(21) Appl. No.: 16/382,046

(22) Filed: Apr. 11, 2019

(65) Prior Publication Data
US 2020/0104210 A1    Apr. 2, 2020

Related U.S. Application Data

(60) Provisional application No. 62/738,721, filed on Sep. 28, 2018.

(51) Int. Cl.
*G06F 11/00* (2006.01)
*G06F 11/10* (2006.01)
(Continued)

(52) U.S. Cl.
CPC ........ *G06F 11/1068* (2013.01); *G06F 11/106* (2013.01); *G06F 11/1008* (2013.01);
(Continued)

(58) Field of Classification Search
CPC ............. G06F 11/1068; G06F 11/1076; G06F 11/1008; G06F 11/106; G06F 11/1056;
(Continued)

(56) References Cited

U.S. PATENT DOCUMENTS

| | | | | |
|---|---|---|---|---|
| 2010/0223531 A1* | 9/2010 | Fukutomi | ........... | G06F 11/1052 714/764 |
| 2013/0305120 A1* | 11/2013 | Torii | ................... | G06F 11/1044 714/764 |

(Continued)

*Primary Examiner* — Albert Decady
*Assistant Examiner* — Osman M Alshack
(74) *Attorney, Agent, or Firm* — Dickinson Wright RLLP

(57) ABSTRACT

Disclosed are techniques for managing parity information for data stored on a storage device. A method can be implemented at a computing device communicably coupled to the storage device, and include (1) receiving a request to write data into a data band of the storage device, (2) writing the data into stripes of the data band, comprising, for each stripe of the data band: (i) calculating first parity information for the data written into the stripe, (ii) writing the first parity information into a volatile memory, and (iii) in response to determining that a threshold number of stripes have been written: converting the first parity information into smaller second parity information, and (3) in response to determining that the data band is read-verified: (i) converting the second parity information into smaller third parity information, and (ii) storing the smaller third parity information into a parity band of the storage device.

20 Claims, 11 Drawing Sheets

(51) Int. Cl.
*G11C 29/52* (2006.01)
*G11C 29/04* (2006.01)
*G11B 20/18* (2006.01)

(52) U.S. Cl.
CPC ...... *G06F 11/1056* (2013.01); *G06F 11/1076* (2013.01); *G11C 29/52* (2013.01); *G11B 20/1833* (2013.01); *G11C 2029/0411* (2013.01)

(58) Field of Classification Search
CPC ............ G11C 29/52; G11C 2029/0411; G11B 20/1833
USPC .................................................. 714/763, 764
See application file for complete search history.

(56) References Cited

U.S. PATENT DOCUMENTS

| | | | |
|---|---|---|---|
| 2014/0129899 A1* | 5/2014 | Kumar | H03M 13/2927 714/755 |
| 2016/0211024 A1* | 7/2016 | Durgam | G11C 29/44 |
| 2017/0093425 A1* | 3/2017 | Mateescu | H03M 13/3761 |
| 2017/0277450 A1* | 9/2017 | Ish | G06F 3/0619 |
| 2018/0039541 A1* | 2/2018 | Hahn | G06F 3/0619 |
| 2018/0074892 A1* | 3/2018 | Shappir | G11C 11/22 |
| 2018/0358988 A1* | 12/2018 | Sharon | H03M 13/255 |
| 2019/0220352 A1* | 7/2019 | Cha | G06F 11/1068 |
| 2019/0310910 A1* | 10/2019 | Kwak | G06F 11/1044 |
| 2020/0026601 A1* | 1/2020 | Ricker | G06F 3/061 |

* cited by examiner

Step 1 – While programming data into a user band of a storage device, RMX parity information is calculated for each stripe of the full wordline and written to an RMX parity region in a volatile memory

TECHNIQUES FOR UTILIZING VOLATILE MEMORY BUFFERS TO REDUCE PARITY INFORMATION STORED ON A STORAGE DEVICE

CROSS-REFERENCE TO RELATED APPLICATIONS

The present application claims the benefit of U.S. Provisional Application No. 62/738,721, entitled "TECHNIQUES FOR UTILIZING VOLATILE MEMORY BUFFERS TO REDUCE PARITY INFORMATION STORED ON A STORAGE DEVICE," filed Sep. 28, 2018, the content of which is incorporated herein by reference in its entirety for all purposes.

FIELD

The described embodiments set forth techniques for establishing redundancy-based protection for data stored on a storage device. In particular, the techniques involve utilizing volatile memory buffers—e.g., dynamic random-access memory (DRAM) buffers—to maintain parity information for data being programmed (i.e., written) to the storage device. The size of the parity information can be succesively reduced in accordance with step-based verifications of the data as it is programmed to the storage device. In turn, the amount of parity information, when ultimately programmed from the volatile memory to the storage device, is significantly reduced, thereby increasing the amount of available storage space in the storage device that would otherwise be consumed by bloated parity information.

BACKGROUND

Solid state drives (SSDs) are a type of mass storage device that share a similar footprint with (and provide similar functionality as) traditional magnetic-based hard disk drives (HDDs). Notably, standard SSDs—which utilize "flash" memory—can provide various advantages over standard HDDs, such as considerably faster Input/Output (I/O) performance. For example, average I/O latency speeds provided by SSDs typically outperform those of HDDs because the I/O latency speeds of SSDs are less-affected when data is fragmented across the memory sectors of SSDs. This occurs because HDDs include a read head component that must be relocated each time data is read/written, which produces a latency bottleneck as the average contiguity of written data is reduced over time. Moreover, when fragmentation occurs within HDDs, it becomes necessary to perform resource-expensive defragmentation operations to improve or restore performance. In contrast, SSDs, which are not bridled by read head components, can largely maintain I/O performance even as data fragmentation levels increase. SSDs also provide the benefit of increased impact tolerance (as there are no moving parts), and, in general, virtually limitless form factor potential. These advantages—combined with the increased availability of SSDs at consumer-affordable prices—make SSDs a preferable choice for mobile devices such as laptops, tablets, and smart phones.

Despite the foregoing benefits provided by SSDs, some drawbacks remain that have yet to be addressed, especially with respect to establishing redundancy-based protection within SSDs. For example, conventional techniques for implementing redundancy-based protection within a given SSD involve writing data (e.g., a user file) across different dies of the SSD, and interleaving parity information for the data within the data itself across the different dies. Unfortunately, this approach establishes a pitfall in which the data becomes unrecoverable when a single die of SSD fails, which is not uncommon. In particular, a single die failure often leads to the loss of both data and its corresponding parity information, thereby thwarting potential recovery scenarios. Notably, the conventional approaches that attempt to alleviate this problem typically come at the cost of significant performance/flexibility reduction and increased storage space consumption, which is undesirable for obvious reasons. Therefore, there exists a need for a technique for improving the overall redundancy-based protection characteristics of a given SSD without requiring significant performance and storage space sacrifices.

SUMMARY

The described embodiments set forth techniques for managing parity information for data stored on a storage device to maintain redundancy-based protection characteristics while decreasing the overall size of the parity information.

One embodiment sets forth a method for managing parity information for data stored on a storage device. According to some embodiments, the method can be implemented at a computing device that includes a volatile memory and is communicably coupled to the storage device, and include the steps of (1) receiving a request to write data into a data band of the storage device, (2) writing the data into stripes of the data band, where writing the data comprises, for each stripe of the data band: (i) calculating first parity information for the data written into the stripe, (ii) writing the first parity information into the volatile memory, and (iii) in response to determining that a threshold number of stripes have been written: converting the first parity information into second parity information that is smaller than the first parity information, and (3) in response to determining that the data band is read-verified: (i) converting the second parity information into third parity information that is smaller than the second parity information, and (ii) storing the third parity information into a parity band of the storage device.

Other embodiments include a non-transitory computer readable storage medium configured to store instructions that, when executed by a processor included in a computing device, cause the computing device to carry out the various steps of any of the foregoing methods. Further embodiments include a computing device that is configured to carry out the various steps of any of the foregoing methods.

Other aspects and advantages of the embodiments described herein will become apparent from the following detailed description taken in conjunction with the accompanying drawings which illustrate, by way of example, the principles of the described embodiments.

BRIEF DESCRIPTION OF THE DRAWINGS

The included drawings are for illustrative purposes and serve only to provide examples of possible structures and arrangements for the disclosed inventive apparatuses and methods for providing wireless computing devices. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

DETAILED DESCRIPTION

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The described embodiments set forth techniques for establishing redundancy-based protection for data stored on a storage device. In particular, the techniques involve utilizing volatile memory buffers—e.g., dynamic random-access memory (DRAM) buffers—to maintain parity information for data being programmed (i.e., written) to the storage device. The size of the parity information can be successively reduced in accordance with step-based verifications of the data as it is programmed to the storage device. In turn, the amount of parity information, when ultimately programmed from the volatile memory buffers to the storage device, is significantly reduced, thereby increasing the amount of available storage space in the storage device that would otherwise be consumed by bloated parity information.

A more detailed discussion of these techniques is set forth below and described in conjunction with FIGS. 1A-1B, 2A-2F, 3A-3B, and 4, which illustrate detailed diagrams of systems and methods that can be configured to implement these techniques.

Figure 1A:
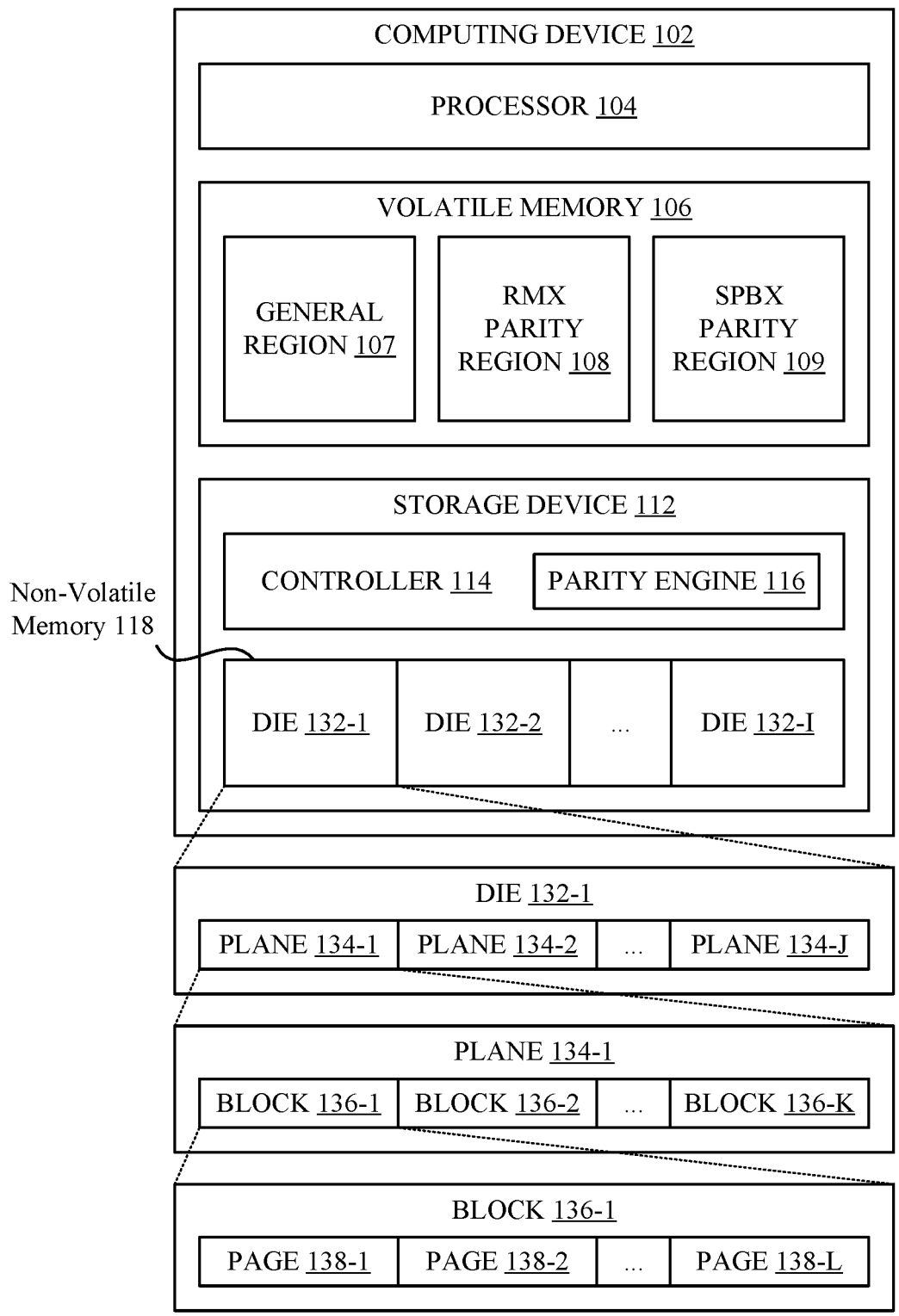
FIGS. 1A-1B illustrate block diagrams of different components of a computing device that can be configured to implement the various techniques described herein, according to some embodiments.

FIG. 1A illustrates a block diagram 100 of a computing device 102—e.g., a smart phone, a tablet, a laptop, a desktop, a server, etc.—that is configured implement the various techniques described herein. As shown in FIG. 1A, the computing device 102 can include a processor 104 that, in conjunction with a volatile memory 106 (e.g., a dynamic random-access memory (DRAM)) and a storage device 112 (e.g., a solid-state drive (SSD)), enables different software entities to execute on the computing device 102. For example, the processor 104 can be configured to load, from the storage device 112 into the volatile memory 106, various components for an operating system. In turn, the operating system can enable the computing device 102 to provide a variety of useful functions, e.g., loading/executing various applications (e.g., operating system daemons, user applications, etc.). It should be understood that the computing device 102 illustrated in FIG. 1A is presented at a high level in the interest of simplifying this disclosure, and that a more detailed breakdown is provided below in conjunction with FIG. 4.

As shown in FIG. 1A, the volatile memory 106 can incorporate a general region 107, a "rich main XOR" (RMX) parity region 108, and a "single plane block XOR" (SPBX) parity region 109. According to some embodiments, the general region 107 can be utilized to store data related to the execution of the operating system/applications on the computing device. Additionally, and as described in greater detail herein, the RMX parity region 108 and the SPBX parity region 109 can be utilized to store parity information that is successively reduced in size in accordance with step-based verifications of data as it is programmed to the storage device 112. A more detailed description of the manner in which the RMX parity region 108 and the SPBX parity region 109 are utilized is provided below in conjunction with FIGS. 2A-2F and FIGS. 3A-3B. It is noted that the embodiments set forth herein do not require the separate regions illustrated in FIG. 1A. On the contrary, the parity information described herein that can be stored in the general region 107 without departing from the scope of this disclosure.

According to some embodiments, and as shown in FIG. 1A, the storage device 112 can include a controller 114 that is configured to orchestrate the overall operation of the storage device 112. For example, the controller 114 can be configured to receive and process input/output (I/O) requests issued by the operating system/applications to the storage device 112. According to some embodiments, the controller 114 can include a parity engine 116 that enables the controller 114 to establish the various parity information (e.g., for user data) described herein. It is noted that the controller 114 can include additional entities (not illustrated in FIG. 1A) that enable the implementation of the various techniques described herein. Is further noted that these entities can be combined or split into additional entities without departing from the scope of this disclosure. It is additionally noted that the various entities described herein can be implemented using software-based or hardware-based approaches.

In any case, as shown in FIG. 1A, the storage device 112 can include a non-volatile memory 118 (e.g., flash memory) that is composed of a collection of dies 132. According to some embodiments, and as shown in FIG. 1A, each die 132 can include a variety of sub-components. In particular, each die 132 can include a collection of planes 134. Moreover, each plane 134 can include a collection of blocks 136. Further, each block 136 can include a collection of pages 138, where each page 138 is composed of a collection of sectors (not individually illustrated in FIG. 1A). In accordance with this breakdown, and as previously described herein, the various components of the non-volatile memory 118 can be logically separated into a collection of bands 130, which are described below in greater detail in conjunction with the block diagram 150 illustrated in FIG. 1B.

Figure 1B:
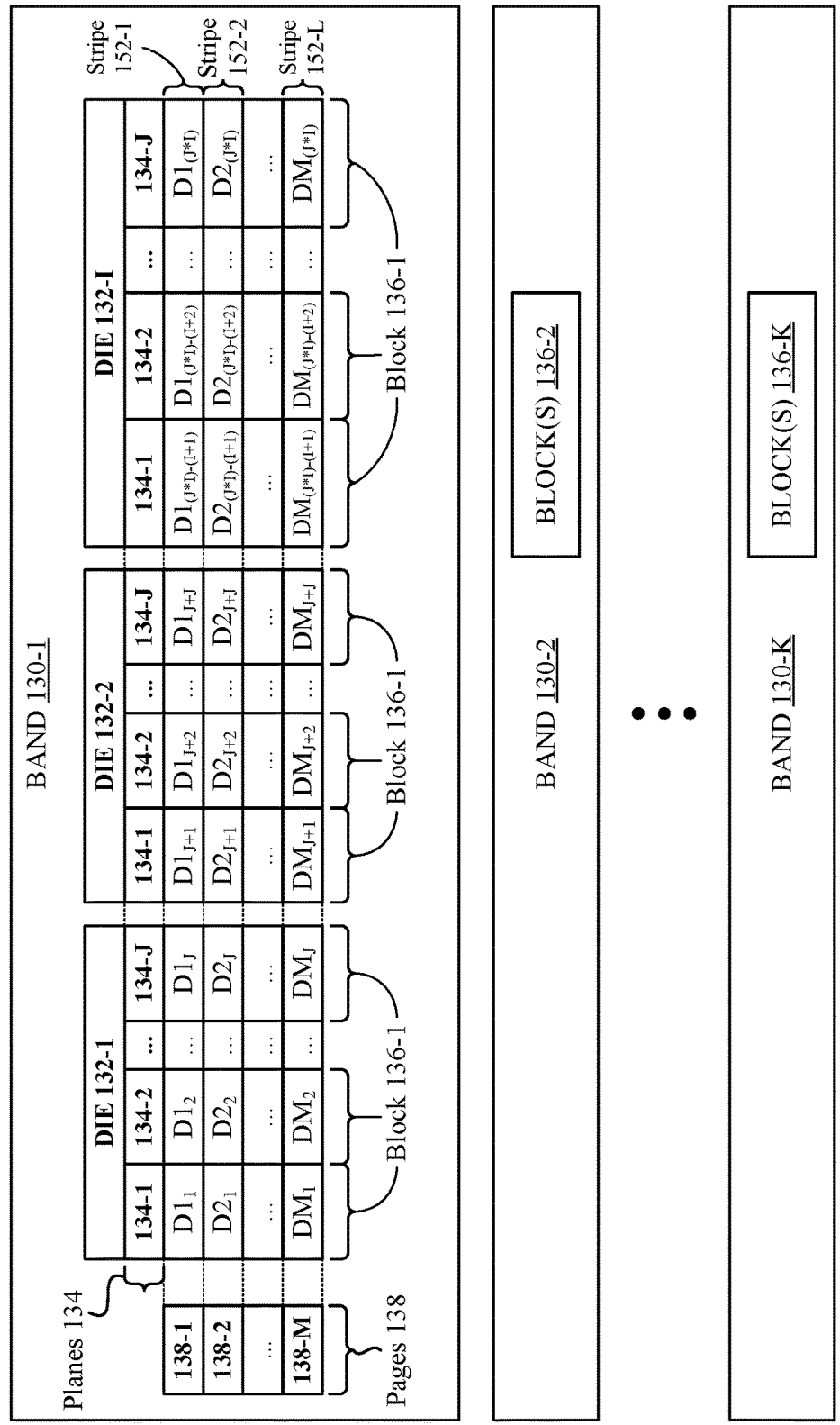

As illustrated in FIG. 1B, each band 130 can logically include a number of dies 132 of the non-volatile memory 118. In this regard, the overall "width" of a given band 130 can be defined by the number of dies 132 that the band 130 spans. Additionally, each band 130 can logically include a particular block 136 across the planes 134 of the dies 132 that are logically included by the band 130. For example, when a given band 130 is configured to span a total of three dies 132, and each die 132 includes three planes 134, (i.e., a total of nine planes 134), a first band 130 of the non-volatile memory 118 can logically include the first block 136 of all nine planes 134, a second band 130 of the non-volatile memory 118 can logically include the second block 136 of all nine planes 134, and so on. It is noted that the logical cutoffs relative to the components of the non-volatile memory 118 (i.e., the dies 132, the planes 134, the blocks 136, the pages 138, etc.) can be modified to control what is logically included by the bands 130. For example, one or more of the dies 132 can be reserved by the storage device 112—e.g., for overprovisioning-based techniques—without departing from the scope of this disclosure, such that a given band 130 logically includes only a subset of the dies 132 that are available within the non-volatile memory 118.

As illustrated in FIG. 1B, each band 130 be separated into a collection of stripes 152, where each stripe 152 within the band 130 logically includes a particular page 138 across the blocks 136/planes 134 that are logically included by the band 130. In this regard, the overall "height" of a given band 130 can be defined by a number of stripes 152 that are logically included by the band 130. Accordingly, when a given band 130 spans three different dies 132, where each die 132 includes three planes 134, and where each plane 134 includes three blocks 136, a total of twenty-seven (27) pages 138 are included in the band 130. As described in greater detail herein, limiting a given band 130 to a particular number of stripes 152 can enable two or more bands 130 to be established relative to the non-volatile memory 118. In this regard, different bands 130 can established and utilized to implement different techniques. For example, a first collection of bands 130 can be utilized to store user data, a second collection of bands 130 can be utilized to store parity information (for redundancy techniques), a third collection of bands can be utilized to store log data, and so on. It is noted that the foregoing bands 130 are merely exemplary, and that any number of bands 130, for any purpose, can be implemented without departing from the scope of this disclosure.

As illustrated in FIG. 1B, data can be disparately distributed across the non-volatile memory 118 as a consequence of the pages 138, blocks 136, planes 134, and dies 132 that are logically included by the bands 130. For example, in FIG. 1B, a first data component can be written across the pages 138:(D1$_1$-D1$_{(J*I)}$) of a first stripe 152-1 that spans the dies 132-(1-I) and the planes 134-(1-J) (of each die 132-(1-I)). Continuing with this example, a second data component can be written across the pages 138:(D2$_1$-D2$_{(J*I)}$) of a second stripe 152-2 that spans the dies 132-(1-I) and the planes 134-(1-J) (of each die 132-(1-I)). It is noted that the first data component and the second data component can be associated with the same or different data objects. For example, a data object having a size that exceeds what can be stored across the pages 138 of the first stripe 152-1 can wrap into the pages 138 of the second stripe 152-2 (and additional stripes 152, if necessary) until the data object is completely stored in the non-volatile memory 118.

It is noted that the breakdown of the non-volatile memory 118 illustrated in FIG. 1B is merely exemplary, and does not, in any manner, represent any limitations associated with the embodiments described herein. On the contrary, the non-volatile memory 118 can include any number of dies 132, planes 134, blocks 136, pages 138, bands 130, stripes 152, bands 130, stripes 152, etc., without departing from the scope of this disclosure.

Accordingly, FIGS. 1A-1B provide high-level overviews of the manner in which the computing device 102 can be configured to implement the techniques described herein. A more detailed explanation of these techniques will now be provided below in conjunction with FIGS. 1A-1B, 2A-2F, 3A-3B, 4, and 5.

Figure 2A:
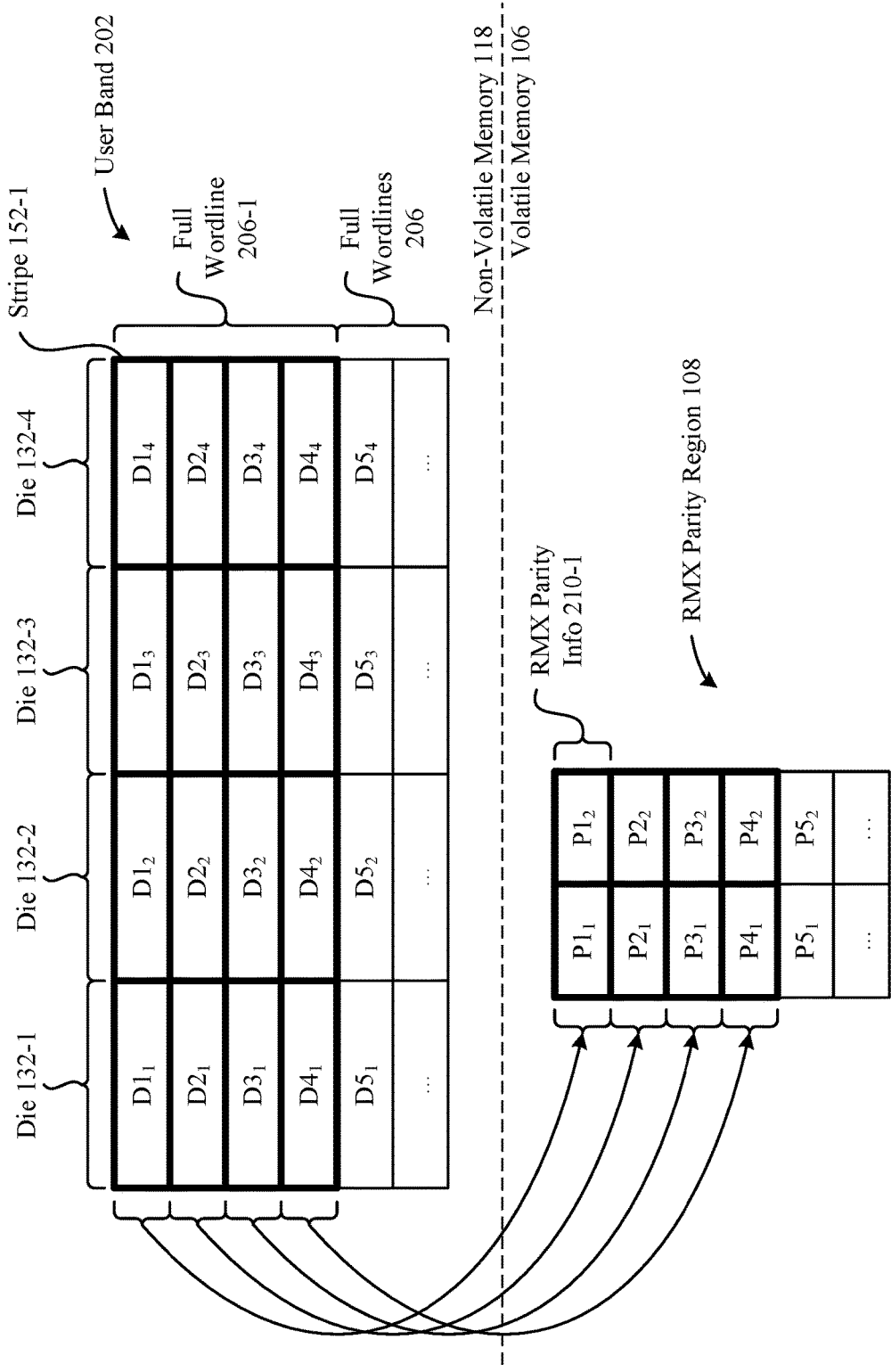
FIGS. 2A-2F illustrate conceptual diagrams of an example scenario in which the size of parity information for data can be successively reduced in accordance with step-based verifications of the data as it is programmed to a non-volatile memory, according to some embodiments.

FIGS. 2A-2F illustrate conceptual diagrams of an example scenario in which the size of parity information for data can be successively reduced in accordance with step-based verifications of the data as it is programmed to the non-volatile memory 118, according to some embodiments. FIG. 2A includes an example architectural layout of the non-volatile memory 118 to provide foundational support for the various techniques that are described in conjunction with FIGS. 2A-2F. In particular, the non-volatile memory 118 includes four dies 132: a die 132-1, a die 132-2, a die 132-3, and a die 132-4. Moreover, the non-volatile memory 118 of the storage device 112 is separated into at least one band 130, which is illustrated in FIG. 2A as the user band 202. As shown in FIG. 2A, the user band 202 is composed of a collection of stripes 152, where the stripes 152 are further segmented into sub-collections of full "wordlines" 206. In particular, in the example scenario illustrated in FIG. 2A, each full wordline 206 logically includes four stripes 152. As described in greater detail below in conjunction with FIG. 2B, each full wordline 206 functions as a checkpoint where the parity information for the data written into the stripes 152 of the full wordline 206 can be converted into a simpler form to reduce the size of the parity information. It is noted that the example architectural layout illustrated throughout FIGS. 2A-2F is basic in the interest of simplifying this disclosure, and that, in typical practices, each die 132 logically includes a collection of pages 138.

In any case, as shown in FIG. 2A, a first step can involve the controller 114 receiving a request to write data (e.g., for a data object) into the user band 202. In response, the controller 114 can be begin programming (i.e., writing) the data into the stripe 152-1 (as pages 138:(D1$_1$, D1$_2$, D1$_3$, and D1$_4$)). In conjunction with programming the data into the stripe 152-1, the controller 114 can be configured to generate RMX parity information 210-1:(P1$_1$, P1$_2$) that corresponds to the data stored in the stripe 152-1. According to some embodiments, the RMX parity information 210-1:(P1$_1$) can correspond to the data stored in the pages 138:(D1$_1$, D1$_2$) of the first half of the stripe 152-1, whereas the RMX parity information 210-1:(P1$_2$) can correspond to the data stored in the pages 138:(D1$_3$, D1$_4$) of the second half of the stripe 152-1. According to some embodiments, the RMX parity information 210-1:(P1$_1$) can be established by calculating a logical function—e.g., an AND function, an OR function, a NOT function, a not AND (NAND) function, a not OR (NOR) function, an exclusive OR (XOR) function, etc.—between the data stored in the pages 138:(D1$_1$, D1$_2$). For example, when the page 138:(D1$_1$) stores a binary value of "1111", and the page 138:(D1$_2$) stores a binary a value of "1110", the XOR of these binary values can be calculated as follows: "1111 XOR 1110=0001." Continuing with this example, when the page 138:(D1$_3$) stores a binary value of "0101", and the page 138:(D1$_4$) stores a binary a value of "0011", the XOR of these pages 138 can be calculated as follows: "0101 XOR 0011=0110." It is noted that the foregoing scenarios involve basic binary numbers in the interest of clarifying this disclosure, and that the parity calculations described herein can involve binary values that are stored in any number of pages 138, that are assigned any data size, and so on, without departing from the scope of this disclosure.

In any case, at the conclusion of calculating the RMX parity information 210-1, the controller 114 stores the RMX parity information 210-1 into the RMX parity region 108. In this manner, the RMX parity information 210-1 can enable the data stored in the stripe 152-1 to be recovered in the event that a multi-plane failure occurs and comprises the data stored in the stripe 152-1. At this juncture, the controller 114 (1) continues programming data into a next stripe 152-2 of the full wordline 206-1, (2) calculates corresponding RMX parity information 210-2:($P2_1$, $P2_2$), and (3) stores the RMX parity information 210-2 into the RMX parity region 108. The controller 114 then (1) continues programming data into a next stripe 152-3 of the full wordline 206-1, (2) calculates corresponding RMX parity information 210-3: ($P3_1$, $P3_2$), and (3) stores the RMX parity information 210-3 into the RMX parity region 108. Further, the controller 114 (1) continues programming data into a next stripe 152-4 of the full wordline 206-1, (2) calculates corresponding RMX parity information 210-4:($P4_1$, $P4_2$), and (3) stores the RMX parity information 210-4 into the RMX parity region 108.

At the conclusion of writing data into the all stripes 152 of the full wordline 206-1—as well as calculating corresponding RMX parity information 210 for the stripes 152 of the full wordline 206-1—all stripes 152 of the full wordline 206-1 are individually protected against multi-plane failures that can potentially affect the data stored in the full wordline 206-1. At this juncture, an opportunity exists to reduce the size of the RMX parity information 210 for the full wordline 206-1. Accordingly, turning now to FIG. 2B, a second step involves the controller 114 converting the RMX parity information 210 into SPBX parity information 216, where the SPBX parity information 216 is smaller in size than the RMX parity information 210. According to some embodiments, converting the RMX parity information 210 into the SPBX parity information 216 can involve performing XOR calculations on the RMX parity information 210. Continuing with the example values set forth above in conjunction with FIG. 2A, where the RMX parity information 210-1:($P1_1$) stores the binary value "0001", and the RMX parity information 210-1:($P1_2$) stores the binary value "0110", the binary value of the SPBX parity information 216-1:(P1) can be calculated as follows: "0001 XOR 0110=0111." According to some embodiments, the binary value of the SPBX parity information 216-1 can then be stored into the SPBX parity region 109. In turn, the same conversion techniques can be applied to the remaining RMX parity information 210, e.g., RMX parity information 210:($P2_1$, $P2_2$) to produce the SPBX parity information 216:(P2), RMX parity information 210:($P3_1$, $P3_2$) to produce the SPBX parity information 216:(P3), and so on, until the SPBX parity information 216-(1-4) is stored in the SPBX parity region 109.

As a brief aside, it is noted that alternative embodiments can involve storing any of the parity information described herein—e.g., the RMX parity information 210, the SPBX parity information 216, etc.—e.g., into the non-volatile memory 118 (opposed to the volatile memory 106)—without departing from the scope of this disclosure. For example, the controller 114 can be configured to store the SPBX parity information 216 into a parity band of the non-volatile memory 118 instead of storing the SPBX parity information 216 into the SPBX parity region 109 of the volatile memory 106 (as described above). When such alternative embodiments are implemented, the controller 114 can be configured to read the parity information from the non-volatile memory 118 (opposed to the volatile memory 106) when appropriate, e.g., when seeking to convert the SPBX parity information 216, when seeking to access the SPBX parity information 216 to perform recovery procedures, and so on.

Figure 2B:
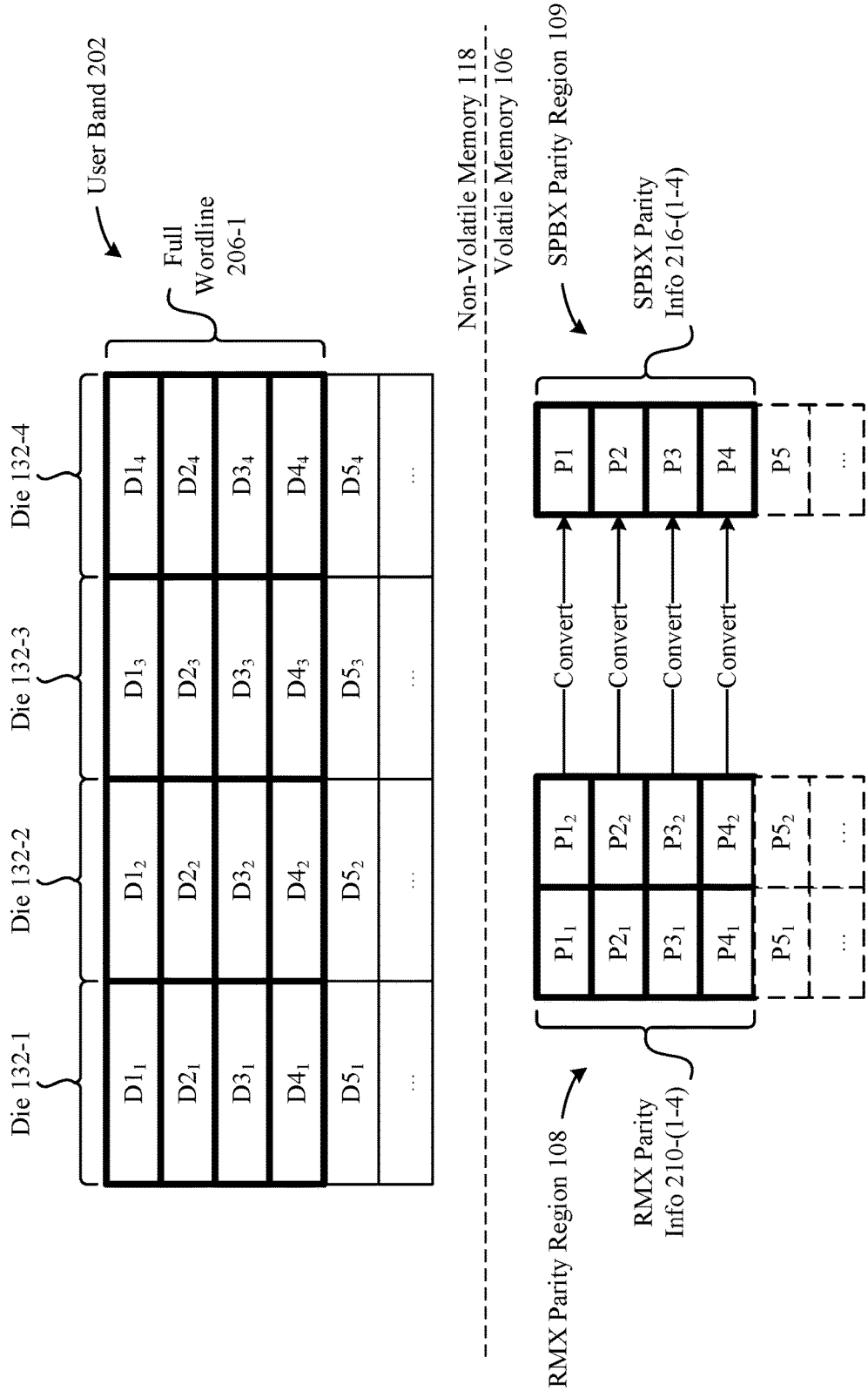
Figure 2C:
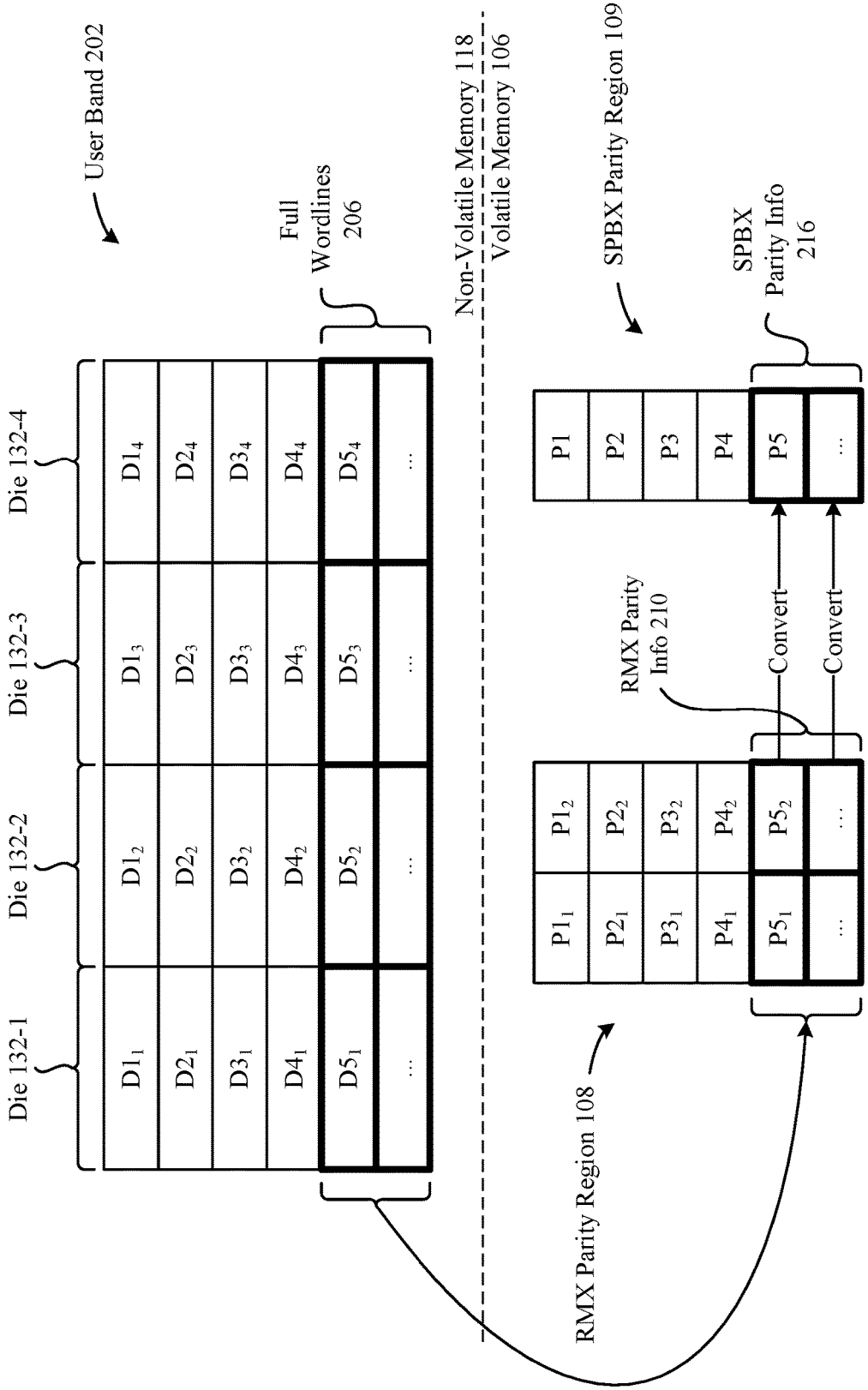

In any case, at the conclusion of the second step of FIG. 2B, the SPBX parity information 216-(1-4) can be utilized to perform recovery procedures in the event that a single plane block failure corrupts the data stored in the stripes 152 of the full wordline 206-1. As shown in FIG. 2C, a third step can involve carrying out the first and second steps (described above in conjunction with FIGS. 2A-2B) against data as it is written into the remaining stripes 152/full wordlines 206 of the user band 202. For example, as shown in FIG. 2C, RMX parity information 210 can be calculated as data is programmed into each stripe 152 of each subsequent full wordline 206 (as described above in conjunction with FIG. 2A). Additionally, the RMX parity information 210 can be converted into SPBX parity information 216 for each subsequent full wordline 206 that is fully programmed with data (as described above in conjunction with FIG. 2B). The foregoing processes are repeated until all stripes 152 of the user band 202 are programmed with data. At this juncture, the SPBX parity information 216 stored in the SPBX parity region 109 can be further-reduced in size through another conversion process, the details of which are set forth below in conjunction with FIG. 2D.

Figure 2D:
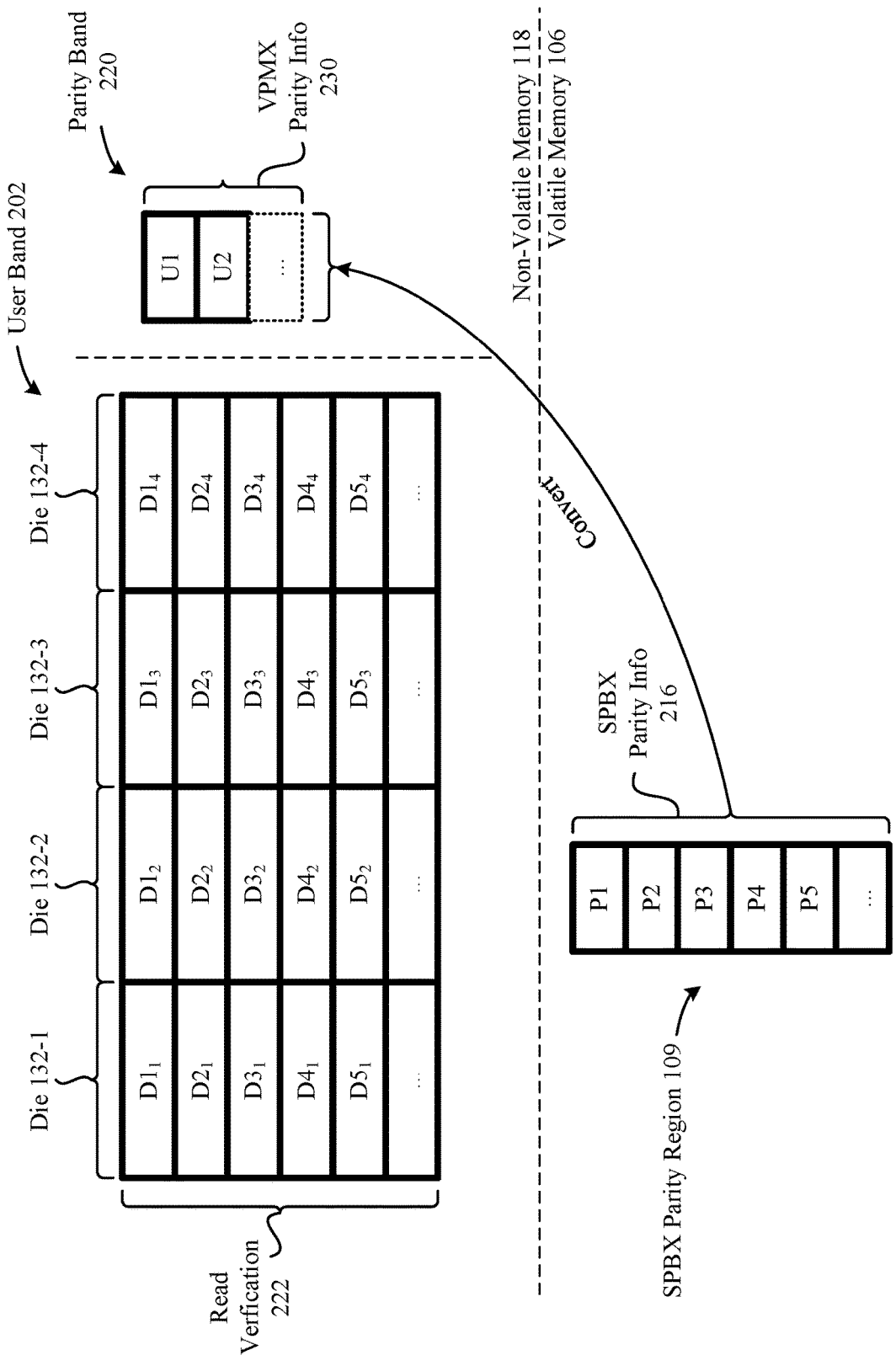
Figure 2E:
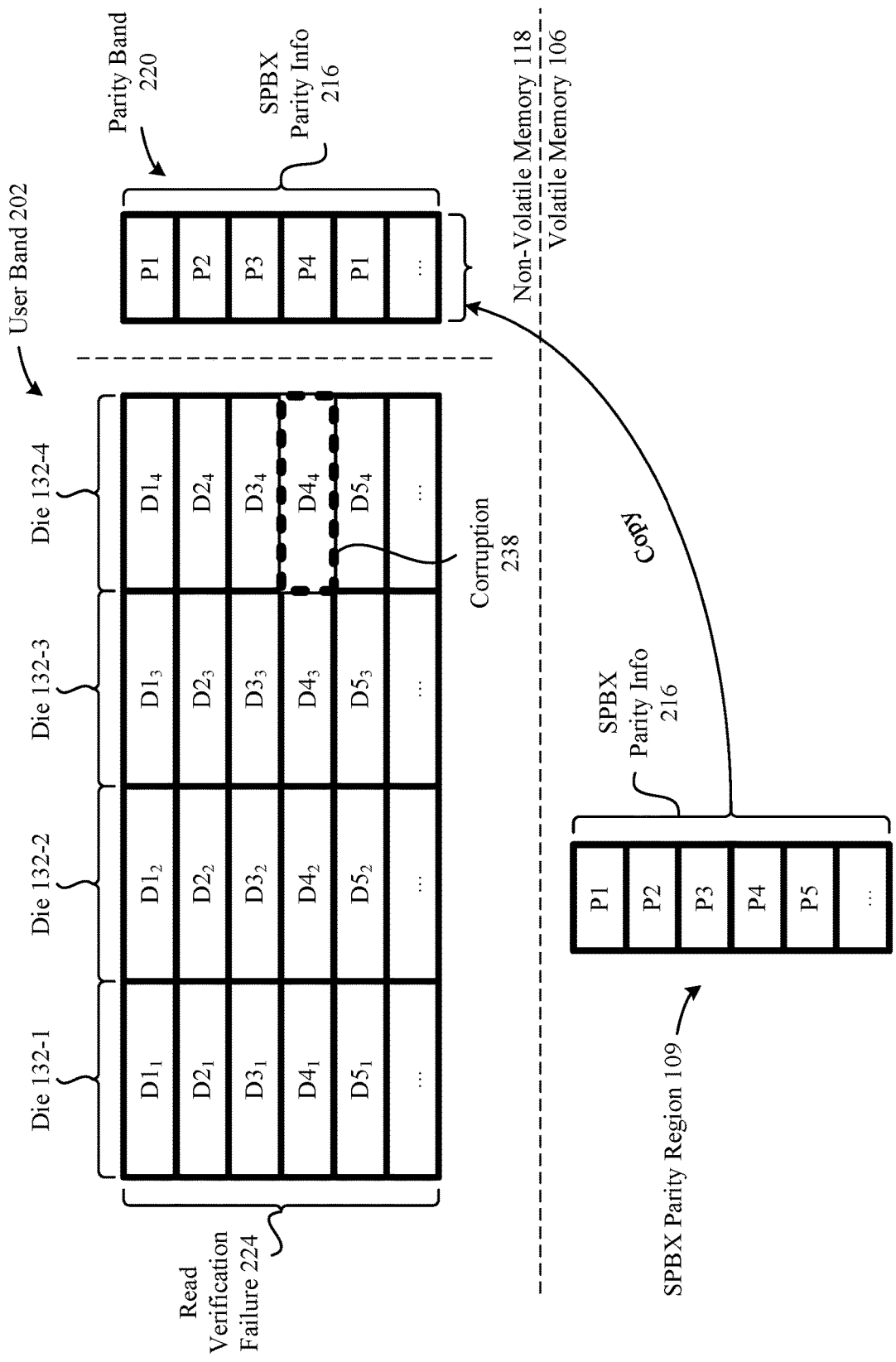

As shown in FIG. 2D, a fourth step can involve the controller 114 performing a read verification of the user band 202 prior to reducing the SPBX parity information 216 in size through a conversion process. In particular, the controller 114 can carry out the fourth step in response to determining that the read verification succeeds (illustrated in FIG. 2D as the read verification 222). It is noted that FIGS. 2E-2F, which are described below, set forth additional steps that can instead be carried out in response to determining that the read verification fails. In any case, as shown in FIG. 2D, reducing the SPBX parity information 216 in size can involve converting the SPBX parity information 216 into "very poor man XOR" (VPMX) parity information 230. According to some embodiments, converting the SPBX parity information 216 into VPMX parity information 230 can involve performing XOR calculations on the SPBX parity information 216. For instance, continuing with the example values set forth above in conjunction with FIG. 2A, where the binary value of the SPBX parity information 216:(P1) is "0111", and where, for example, the binary value of the SPBX parity information 216-1:(P2) is "1100", the binary value of the VPMX parity information 230:(U1) can be calculated as follows: "0111 XOR 1100=1011." In a similar vein, the controller 114 can perform additional XOR calculations in accordance with subsequent SPBX parity information 216:(P3, P4, . . . ) to produce additional VPMX parity information 230:(U2, . . . ). In turn, the VPMX parity information 230 can be stored into a parity band 220 of the non-volatile memory 118.

Accordingly, at the conclusion of writing the VPMX parity information 230 into the parity band 220, the VPMX parity information 230 effectively provides single plane/single wordline parity protection for the user band 202. At this juncture, the controller 114 can resume programming new data into the bands 130 in accordance with parity protection schemes described above in conjunction with FIGS. 2A-2D.

Figure 2F:
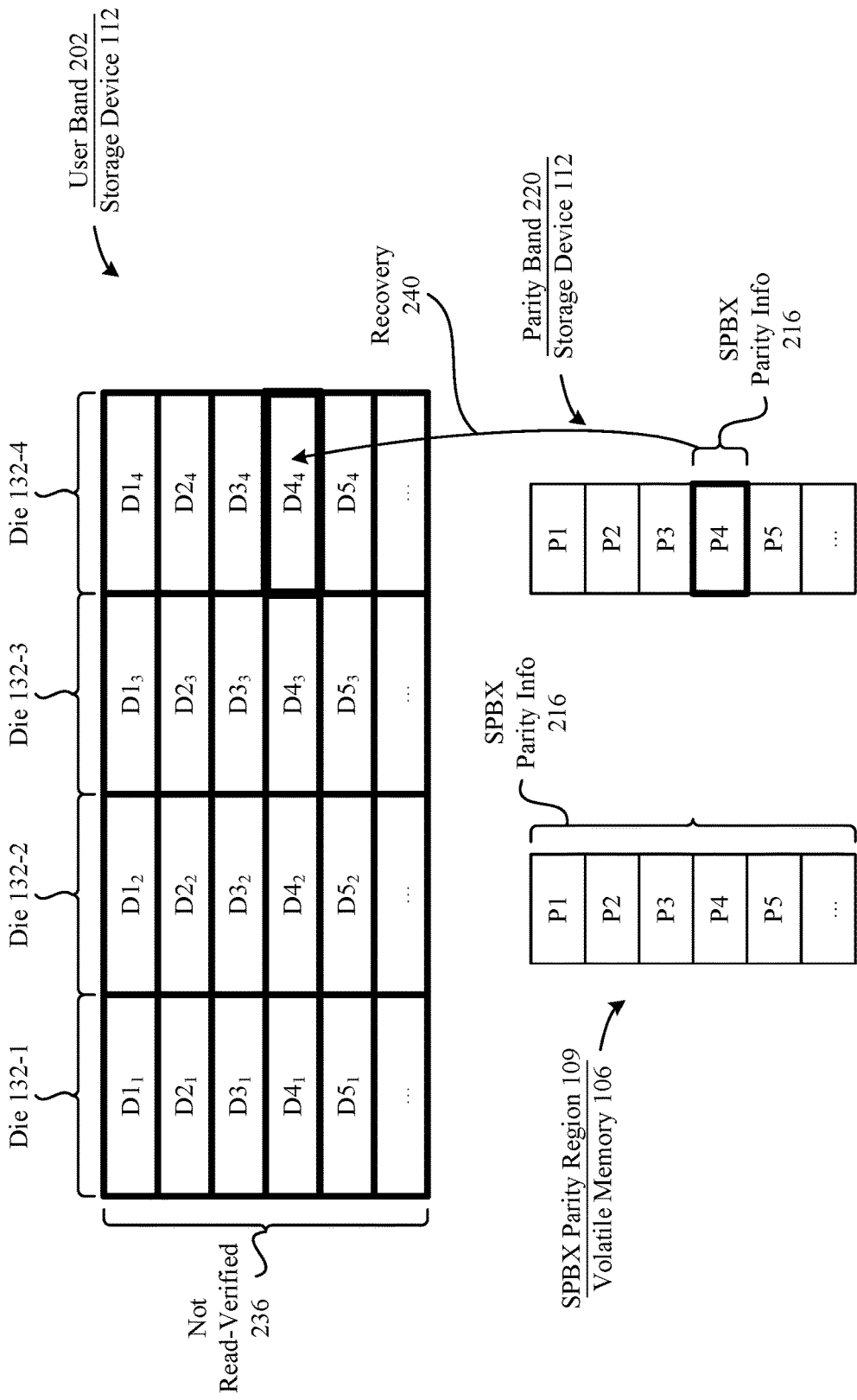

As noted above, FIGS. 2E-2F set forth additional steps that can be carried out in response to identifying a failure when attempting to perform the read verification (described above in conjunction with FIG. 2D) of the user band 202. In particular, step five of FIG. 2F illustrates an example scenario that can occur when the read verification fails (illustrated as the read verification failure 224 in FIG. 2E), where a corruption 238 occurs with respect to the page 138:($D4_4$). In response to the read verification failure 224, the controller 114 can be configured to copy (i.e., write) the SPBX parity information 216 into the parity band 220 of the non-volatile memory 118, thereby cancelling the conversion procedures (into VPMX parity information 230) that otherwise take place when the read verification succeeds. In turn, a sixth step illustrated in FIG. 2F can involve the controller 114 utilizing the SPBX parity information 216 (stored in the parity band 220) to perform a recovery procedure of the data that should be stored by the page 138:($D4_4$), which is illustrated in FIG. 2F as the recovery 240. In particular, and as shown in FIG. 2F, the controller 114 can utilize the SPBX parity information 216:(P4) to recover the page 138:($D4_4$) by virtue of the XOR techniques described herein. According to some embodiments, when the underlying hardware for the page 138:($D4_4$) is functional, the controller 114 can restore the data in-place within the page 138:($D4_4$). Alternatively, the controller 114 can copy the restored data into another functional page 138, and update associated data structures (where appropriate) to reflect the new location of the restored data.

As an additional brief aside, it is noted that a program failure can occur at any point as the controller 114 is programming data into the user band 202 in accordance with the techniques described above. For example, when a program failure occurs while writing a stripe 152, where only a portion of the stripe 152 is programmed, the controller 114 can be configured to (1) read, from the RMX parity region 108, any RMX parity information 210 that has been calculated for other stripes 152 of the band 130 in which the stripe 152 is included, and (2) store the VPMX parity information 230 into the non-volatile memory 118 (e.g., into a parity band). The controller 114 can also be configured (1) read, from the SPBX parity region 109, any SPBX parity information 216 that has been calculated from RMX parity information 210 (for the stripes 152 of the band 130), and (2) store the SPBX parity information 216 into the non-volatile memory 118 (e.g., into the aforementioned parity band). In turn, the controller 114 can abort programming the data band, perform recovery procedures (if possible), and resume programming the data into a new data band.

Figure 3A:
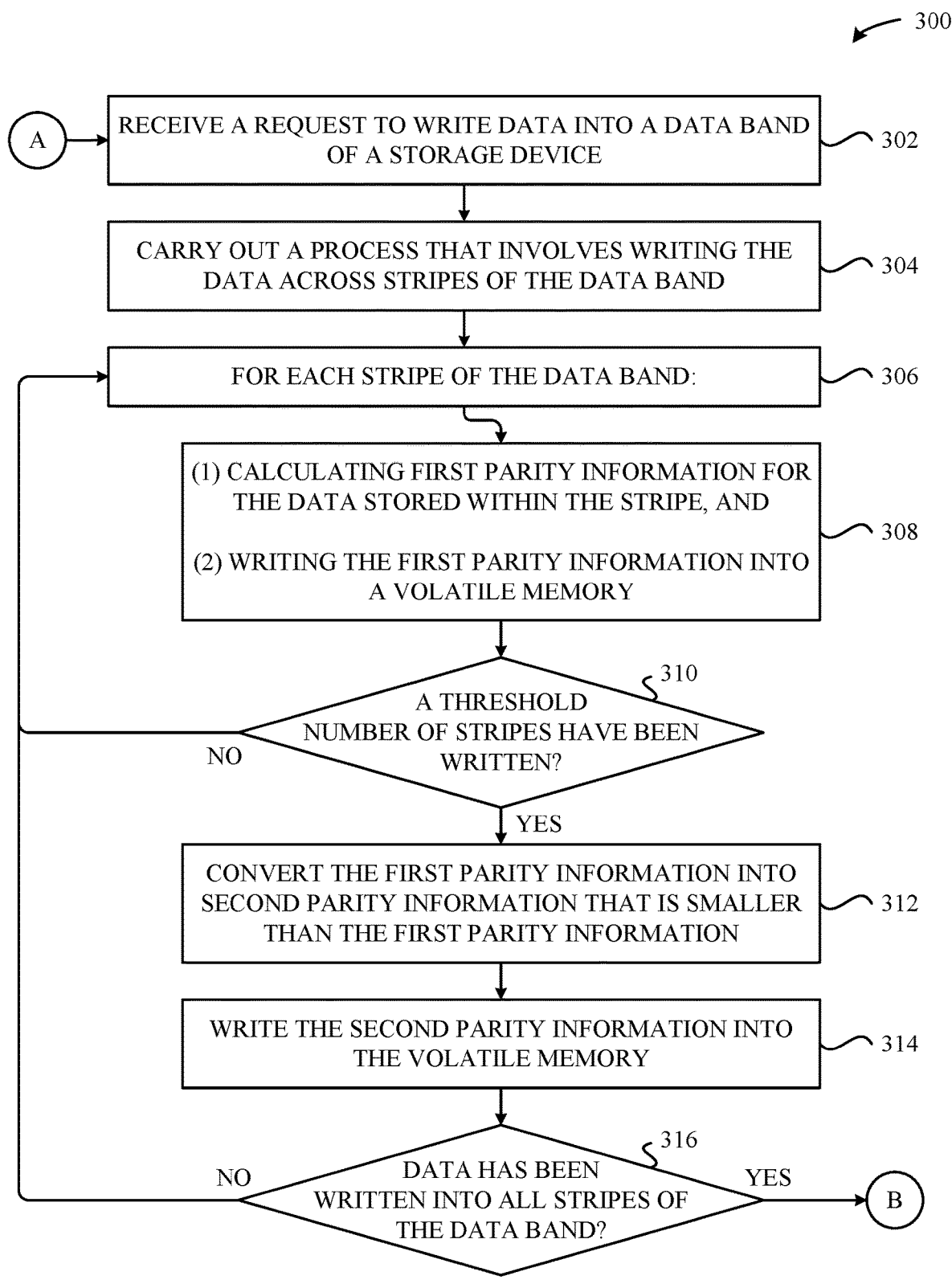
FIGS. 3A-3B illustrate a method that can be implemented to carry out the technique described in conjunction with FIGS. 2A-2F, according to some embodiments.

Accordingly, FIGS. 2A-2F illustrate an example breakdown of the manner in which the size of parity information for data can be reduced in accordance with step-based verifications of the data as it is programmed to the non-volatile memory 118. Additional high-level details will now be provided below in conjunction with FIGS. 3A-3B, which illustrate a method 300 that can be implemented to carry out the technique described above in conjunction with FIGS. 2A-2F, according to some embodiments. As shown in FIG. 3A, the method 300 begins at step 302, where the controller 114 receives a request to write data into a data band of a storage device (e.g., as described above in conjunction with FIG. 2A). At step 304, the controller 114 carries out a process that involves writing the data across stripes of the data band (e.g., as also described above in conjunction with FIG. 2A).

At step 306, the controller 114 executes steps 308-316 while processing each stripe of the data band. In particular, at step 308, the controller 114 (1) calculates first parity information (e.g., RMX parity information) for the data stored within the stripe, and (2) writes the first parity information into a volatile memory (e.g., as described above in conjunction with FIG. 2A). Again, it is noted that alternative embodiments can involve storing the first parity information into the non-volatile memory. At step 310, the controller 114 determines whether a threshold number of stripes (e.g., a full wordline) have been written (e.g., as described above in conjunction with FIGS. 2A-2B). If, at step 310, the controller 114 determines that a threshold number of stripes have been written, then the method 300 proceeds to step 312, which is described below in greater detail. Otherwise, the method 300 proceeds back to step 306, where a next stripe of the data band is processed by the controller 114 in accordance with steps 308-316.

Figure 3B:
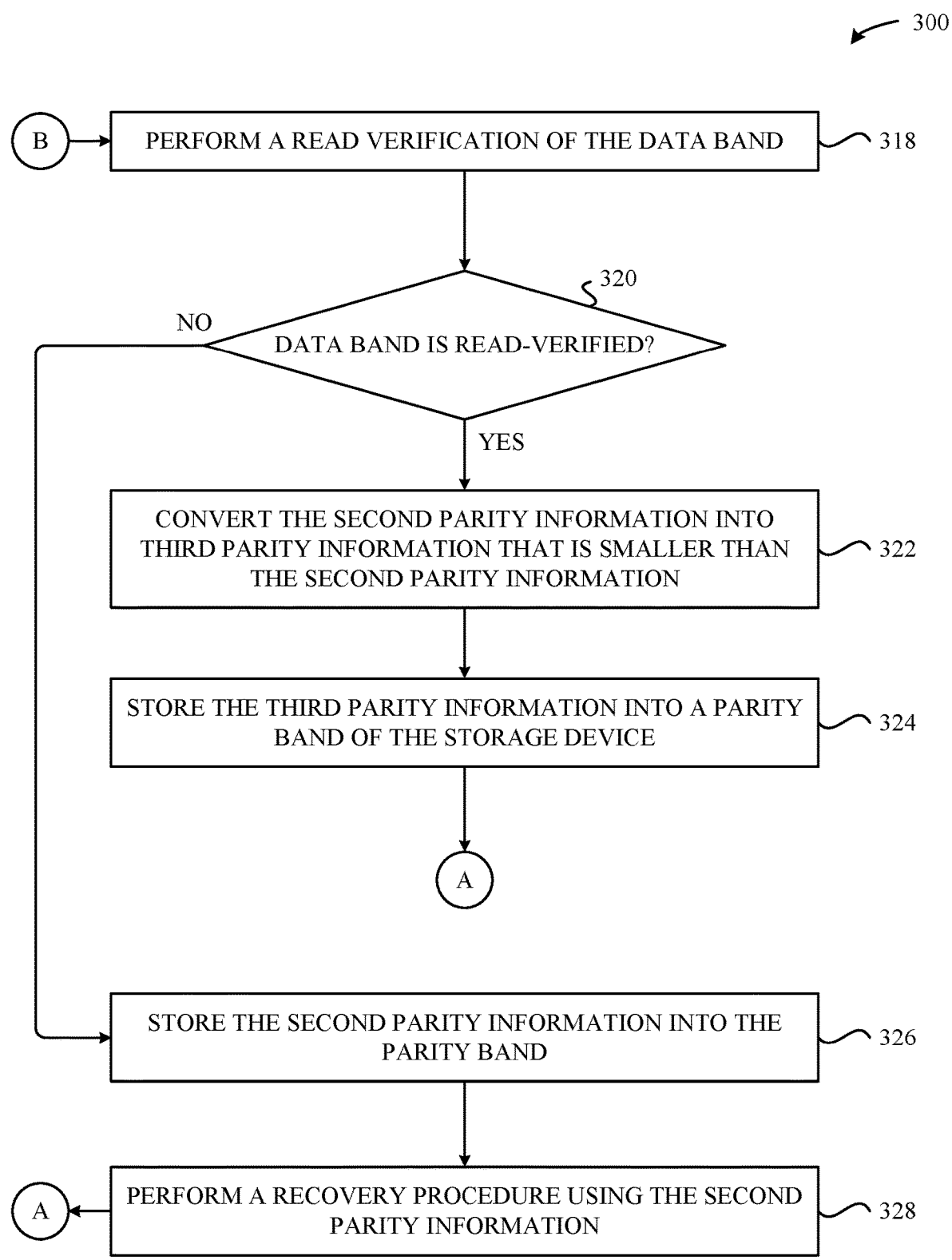

At step 312, the controller 114 converts the first parity information into second parity information (e.g., SPBX parity information) that is smaller than the first parity information (e.g., as described above in conjunction with FIGS. 2B-2C). At step 314, the controller 114 writes the second parity information into the volatile memory (e.g., as described above in conjunction with FIGS. 2B-2C). At step 316, the controller 114 determines whether data has been written into all stripes of the data band (e.g., as described above in conjunction with FIGS. 2C-2D). If, at step 316, the controller 114 determines that data has been written into all stripes of the data band, then the method 300 proceeds to step 318, which is illustrated in FIG. 3B and described below in greater detail. Otherwise, the method 300 proceeds back to step 306, where subsequent stripes are processed until all stripes of the data band is fully processed.

At step 318, the controller 114 performs a read verification of the data band (e.g., as described above in conjunction with FIG. 2D). At step 320, the controller 114 determines whether data band is read-verified. If, at step 320, the controller 114 determines that data band is read-verified, then the method 300 proceeds to step 322. Otherwise, the method 300 proceeds to step 326, which is described below in greater detail.

At step 322, the controller 114 converts the second parity information into third parity information (e.g., VPMX parity information) that is smaller than the second parity information (e.g., as described above in conjunction with FIG. 2D). At step 324, the controller 114 stores the third parity information into a parity band of the storage device (e.g., as also described above in conjunction with FIG. 2D). As noted above, the method 300 proceeds to step 326 when the data band is not read verified. At step 326, the controller 114 stores the second parity information into the parity band (e.g., as described above in conjunction with FIG. 2E). At step 328, the controller 114 performs a recovery procedure using the second parity information (e.g., as described above in conjunction with FIG. 2F).

It is noted that this disclosure primarily involves the controller 114 carrying out the various techniques described herein for the purpose of unified language and simplification. However, it is noted that other entities can be configured to carry out these techniques without departing from this disclosure. For example, other software components (e.g., the operating system, applications, firmware(s), etc.) executing on the computing device 102/storage device 112 can be configured to carry out all or a portion of the techniques described herein without departing from the scope of this disclosure. Moreover, other hardware components included in the computing device 102/storage device 112 can be configured to carry out all or a portion of the techniques described herein without departing from the scope of this disclosure. Further, all or a portion of the techniques described herein can be offloaded to one or more other computing devices without departing from the scope of this disclosure.

Figure 4:
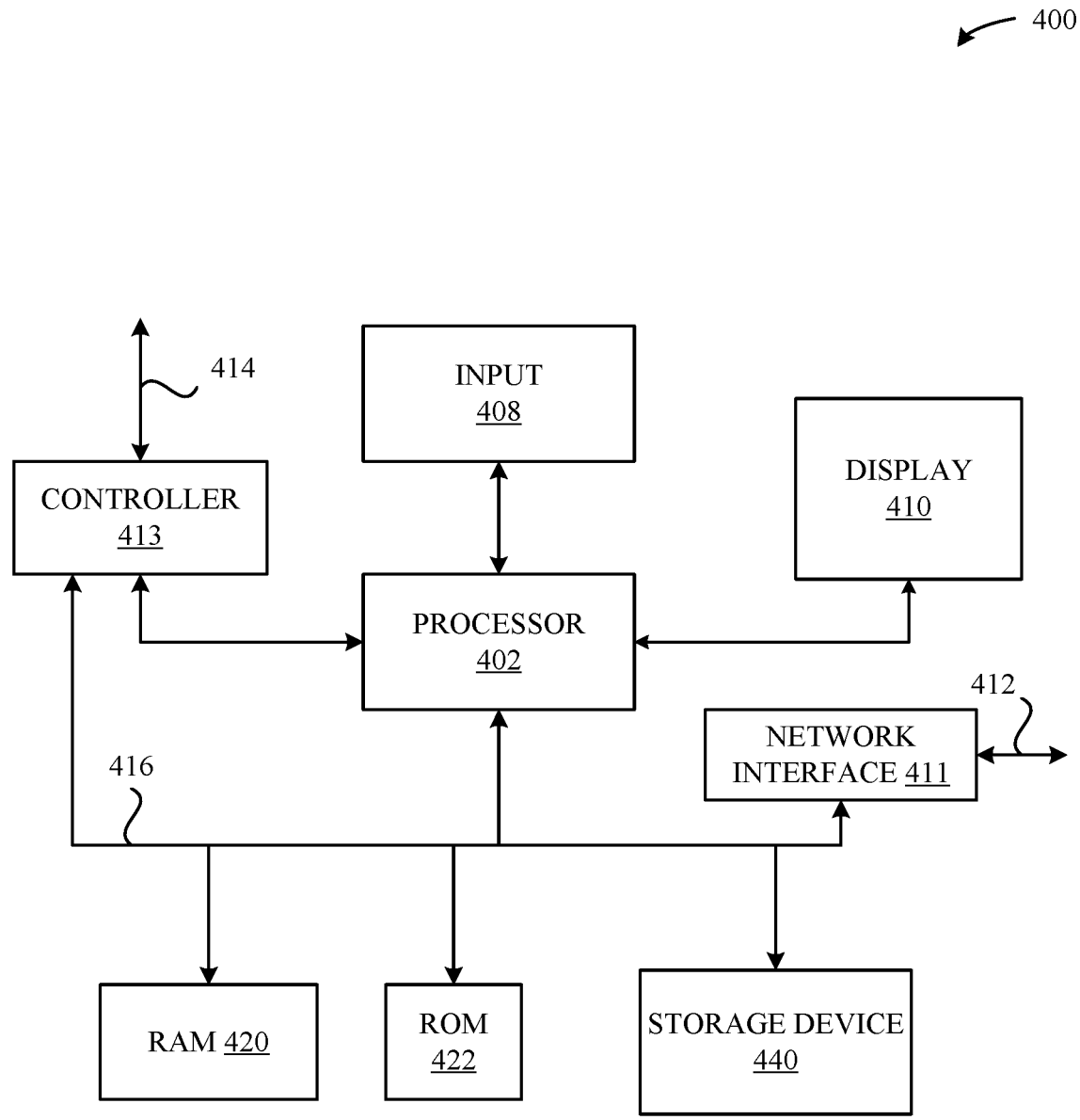
FIG. 4 illustrates a detailed view of a computing device that can be configured to implement the various components described herein, according to some embodiments.

FIG. 4 illustrates a detailed view of a computing device 400 that can represent the computing device 102 of FIG. 1A, according to some embodiments. As shown in FIG. 4, the computing device 400 can include a processor 402 that represents a microprocessor or controller for controlling the overall operation of the computing device 400. The computing device 400 can also include a user input device 408 that allows a user of the computing device 400 to interact with the computing device 400. For example, the user input device 408 can take a variety of forms, such as a button, keypad, dial, touch screen, audio input interface, visual/image capture input interface, input in the form of sensor data, and so on. Still further, the computing device 400 can include a display 410 that can be controlled by the processor 402 (e.g., via a graphics component) to display information to the user. A data bus 416 can facilitate data transfer between at least a storage device 440, the processor 402, and a controller 413. The controller 413 can be used to interface with and control different equipment through an equipment control bus 414. The computing device 400 can also include a network/bus interface 411 that couples to a data link 412. In the case of a wireless connection, the network/bus interface 411 can include a wireless transceiver.

As noted above, the computing device 400 also includes the storage device 440, which can comprise a single disk or a collection of disks (e.g., hard drives). In some embodiments, storage device 440 can include flash memory, semiconductor (solid state) memory or the like. The computing device 400 can also include a Random-Access Memory (RAM) 420 and a Read-Only Memory (ROM) 422. The ROM 422 can store programs, utilities or processes to be executed in a non-volatile manner. The RAM 420 can provide volatile data storage, and stores instructions related to the operation of applications executing on the computing device 400.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for managing parity information for data stored on a storage device, the method comprising, at a computing device that includes a volatile memory and is communicatively coupled to the storage device:
   receiving a request to write data into a data band of the storage device, wherein the storage device is logically separated into a collection of data bands, and each data band in the collection of data bands is logically separated into stripes;
   writing the data into the stripes of the data band, wherein writing the data comprises, for each stripe of the data band:
      calculating first parity information for the data written into the stripe,
      writing the first parity information into the volatile memory, and
      in response to determining that a threshold number of stripes have been written:
         converting the first parity information into second parity information that is smaller than the first parity information; and
   in response to determining that the data band is read-verified:
      converting the second parity information into third parity information that is smaller than the second parity information, and
      storing the third parity information into a parity band of the storage device.

2. The method of claim 1, further comprising, in response to determining that the data band is not read-verified:
   storing the second parity information into the parity band, and
   performing a recovery procedure using the second parity information.

3. The method of claim 1, further comprising, prior to determining that the data band is read-verified:
   determining that data has been written into all stripes of the data band.

4. The method of claim 1, wherein:
   the first parity information is written into a first area of the volatile memory, and
   the second parity information is written into a second area of the volatile memory that is distinct from the first area of the volatile memory.

5. The method of claim 1, wherein converting the first parity information into second parity information comprises, for each first element of a plurality of first elements of which the first parity information is comprised:
   identifying a complementary second element to the first element;
   performing a logical function against the first element and the complementary second element to produce a result; and
   storing the result into the second parity information.

6. The method of claim 1, wherein the data band logically includes a plurality of blocks of the storage device, and each block of the plurality of blocks is disposed within a respective plane of a respective die of the storage device.

7. The method of claim 6, wherein each stripe logically includes a plurality of pages of the storage device, and each page of the plurality of pages is disposed within a respective block of the plurality of blocks.

8. The method of claim 1, further comprising, for a given stripe of the data band:
   removing the first parity information from the volatile memory subsequent to converting the first parity information into the second parity information.

9. At least one non-transitory computer readable storage medium configured to store instructions that, when executed by at least one processor included in a computing device, cause the computing device to manage parity information for data stored on a storage device that is communicably coupled to the computing device, by carrying out steps that include:

receiving a request to write data into a data band of the storage device, wherein the storage device is logically separated into a collection of data bands, and each data band in the collection of data bands is logically separated into stripes;

writing the data into the stripes of the data band, wherein writing the data comprises, for each stripe of the data band:

calculating first parity information for the data written into the stripe, writing the first parity information into a volatile memory of the computing device, and in response to determining that a threshold number of stripes have been written:

converting the first parity information into second parity information that is smaller than the first parity information; and in response to determining that the data band is read-verified:

converting the second parity information into third parity information that is smaller than the second parity information, and storing the third parity information into a parity band of the storage device.

10. The at least one non-transitory computer readable storage medium of claim 9, wherein the steps further include, in response to determining that the data band is not read-verified:

storing the second parity information into the parity band, and performing a recovery procedure using the second parity information.

11. The at least one non-transitory computer readable storage medium of claim 9, wherein the steps further include, prior to determining that the data band is read-verified:

determining that data has been written into all stripes of the data band.

12. The at least one non-transitory computer readable storage medium of claim 9, wherein:

the first parity information is written into a first area of the volatile memory, and the second parity information is written into a second area of the volatile memory that is distinct from the first area of the volatile memory.

13. The at least one non-transitory computer readable storage medium of claim 9, wherein converting the first parity information into second parity information comprises, for each first element of a plurality of first elements of which the first parity information is comprised:

identifying a complementary second element to the first element;

performing a logical function against the first element and the complementary second element to produce a result; and storing the result into the second parity information.

14. The at least one non-transitory computer readable storage medium of claim 9, wherein the data band logically includes a plurality of blocks of the storage device, and each block of the plurality of blocks is disposed within a respective plane of a respective die of the storage device.

15. A computing device configured to manage parity information for data stored on a storage device that is communicably coupled to the computing device, the computing device comprising:

at least one processor; and at least one volatile memory storing instructions that, when executed by the at least one processor, cause the computing device to:

receive a request to write data into a data band of the storage device, wherein the storage device is logically separated into a collection of data bands, and each data band in the collection of data bands is logically separated into stripes;

write the data into the stripes of the data band, wherein writing the data comprises, for each stripe of the data band:

calculate first parity information for the data written into the stripe, write the first parity information into the at least one volatile memory, and in response to determining that a threshold number of stripes have been written:

convert the first parity information into second parity information that is smaller than the first parity information; and in response to determining that the data band is read-verified:

convert the second parity information into third parity information that is smaller than the second parity information, and store the third parity information into a parity band of the storage device.

16. The computing device of claim 15, wherein the at least one processor further causes the computing device to, in response to determining that the data band is not read-verified:

store the second parity information into the parity band, and perform a recovery procedure using the second parity information.

17. The computing device of claim 15, wherein the at least one processor further causes the computing device to, prior to determining that the data band is read-verified:

determining that data has been written into all stripes of the data band.

18. The computing device of claim 15, wherein:

the first parity information is written into a first area of the at least one volatile memory, and the second parity information is written into a second area of the at least one volatile memory that is distinct from the first area of the at least one volatile memory.

19. The computing device of claim 15, wherein converting the first parity information into second parity information comprises, for each first element of a plurality of first elements of which the first parity information is comprised:

identifying a complementary second element to the first element;

performing a logical function against the first element and the complementary second element to produce a result; and storing the result into the second parity information.

20. The computing device of claim 15, wherein the data band logically includes a plurality of blocks of the storage device, and each block of the plurality of blocks is disposed within a respective plane of a respective die of the storage device.

* * * * *